United States Patent [19]

Nacci et al.

[11] 4,180,403

[45] Dec. 25, 1979

[54] PHOTOHARDENABLE FILMS HAVING HIGH RESOLUTION CONTAINING NITROSO DIMERS

[75] Inventors: George R. Nacci, Wilmington; José F. Pazos, Claymont, both of Del.

[73] Assignee: E. I. Du Pont de Nemours and Company, Wilmington, Del.

[21] Appl. No.: 858,350

[22] Filed: Dec. 7, 1977

Related U.S. Application Data

[63] Continuation-in-part of Ser. No. 697,947, Jun. 21, 1976, abandoned, which is a continuation-in-part of Ser. No. 554,228, Feb. 28, 1975, abandoned, which is a continuation-in-part of Ser. No. 423,989, Dec. 12, 1973, abandoned, which is a continuation-in-part of Ser. No. 324,877, Jan. 18, 1973, abandoned.

[51] Int. Cl.$^2$ .................................................. G03C 1/68
[52] U.S. Cl. ............................... 430/281; 204/159.18; 204/159.23; 430/917
[58] Field of Search ........................... 96/115 R, 35.1; 204/159.18, 159.23

[56] References Cited

U.S. PATENT DOCUMENTS

| | | | |
|---|---|---|---|
| 2,727,022 | 3/1960 | Martin et al. | 96/115 P |
| 2,929,710 | 3/1960 | Martin | 96/87 R |
| 3,203,801 | 8/1965 | Heiart | 96/87 R |
| 3,367,305 | 2/1968 | Ciurca et al. | 96/54 |
| 3,479,185 | 11/1969 | Chambers et al. | 96/87 R |
| 3,625,696 | 12/1971 | Krauch et al. | 96/86 P |
| 3,953,444 | 4/1976 | Singh et al. | 260/150 AC |

OTHER PUBLICATIONS

Chem. Abstracts, vol. 60, 3121(g), (1964).
Hartel, Chimia, 19, 116–120, (1965).
Tyudesh et al, Kinetics and Catalysis, (USSR) 6, pp. 175–181 (1965).
Bluhm et al, Nature, vol. 215, pp. 1478–1479, (1967).

*Primary Examiner*—Jack P. Brammer

[57] ABSTRACT

Photohardenable films containing a photoactivated free-radical initiator and an inhibitor system composed of a noninhibiting nitroso dimer which dissociates to inhibiting nitroso monomer characterized by a dissociation constant of about $10^{-2}$–$10^{-10}$ in solution at 25° C. and a dissociation half-life of at least about 0.5 minute in solution at 25° C., and having an optical density to initiating radiation of about 0.02–1.25 have high resolution after exposure at the proper energy density and time.

11 Claims, No Drawings

PHOTOHARDENABLE FILMS HAVING HIGH RESOLUTION CONTAINING NITROSO DIMERS

CROSS-REFERENCE TO RELATED APPLICATIONS

This is a continuation-in-part of our application Ser. No. 697,947, filed June 21, 1976, now abandoned; which is in turn a continuation-in-part of our application Ser. No. 554,228, filed Feb. 28, 1975, now abandoned; which is in turn a continuation-in-part of our application Ser. No. 423,989, filed Dec. 12, 1973, now abandoned; which is in turn a continuation-in-part of our application Ser. No. 324,877, filed Jan. 18, 1973, now abandoned.

BACKGROUND OF THE INVENTION

1. Field of the Invention

This invention relates to photohardenable films or coatings, and more particularly to improved films having high resolution. Still more particularly, it relates to the addition of certain nitroso dimers to photohardenable films to obtain said high resolution.

2. The Prior Art

It is known that certain aromatic nitroso compounds are useful as polymerization inhibitors. For example, Hungarian Pat. No. 150,550 (1963) describes the use of p-aminonitrosobenzene and α-nitroso-β-naphthol as inhibitors for the free-radical polymerization of styrene. It is also known that N-nitrosocyclohexylhydroxylamine salts serve as thermal polymerization inhibitors in the preparation of photopolymers (U.S. Pat. No. 3,625,696). Similarly, the use of 4-nitrosophenol, 1,4-dinitrosobenzene, nitrosoresorcinol, p-nitrosodimethylaniline and other nitroso compounds as inhibitors for styrene and vinyl acetate polymerizations is described by Hartel, in Chimia (Aarau), 19, p 116 (1965); and Tyudesh et al., in Kinetics and Catalysis (USSR), 6, p 175–181 (1965). Heiart, in U.S. Patent 3,203,801, describes the use of N-substituted p-nitrosoanilines as sensitometric modifiers in photopolymerization systems. Unfortunately, when these nitroso compounds are used in photopolymerizable compositions, they inhibit the photopolymerization reaction as well as the thermally-induced polymerization reaction.

It is also known that aliphatic nitroso dimers can be dissociated to nitroso monomers, either thermally or by irradiation with short wavelength ultraviolet radiation (Bluhm et al., Nature, 215, p 1478, 1967).

SUMMARY OF THE INVENTION

The present invention comprises photohardenable films which consist essentially of (a) a substantially solid organic composition comprising an addition-polymerizable, nongaseous ethylenically unsaturated compound capable of forming a high polymer by free-radical initiated chain-propagating addition polymerization and a macromolecular organic polymeric binder, (b) about 0.04–3% by weight, preferably about 0.1–2% by weight, and most preferably about 0.3–1.5% by weight, based on the total film material, of solvent-soluble nitroso dimer which is a noninhibitor of free-radical polymerization but dissociates to nitroso monomer which is an inhibitor of free-radical polymerization, contains a dinitroso group, and is characterized by a dissociation constant of about $10^{-2}$–$10^{-10}$ in solution at 25° C. and a rate of dissociation having a half-life of at least about 0.5 minute in solution at 25° C., and (c) about 1.0–10% by weight, based on the total film material, of an organic, radiation-sensitive free-radical generating system activatable by actinic radiation which initiates polymerization of the unsaturated compound and does not dissociate the nitroso dimer to nitroso monomer, with the proviso that the weight ratio of nitroso dimer to free-radical generating system is no greater than 2:1, said free-radical generating system being proportioned to give said film at its particular thickness a mean optical density of about 0.02–1.25, and preferably about 0.24–0.51, to radiation in the spectral region in which the free-radical generating system absorbs radiation.

DESCRIPTION OF THE PREFERRED EMBODIMENTS

The present invention is directed to photohardenable films which can provide higher resolution than similar films of the prior art. These photohardenable films are generally in the form of a coating such as a photoresist coating on a substrate.

Photohardenable compositions wherein an unsaturated compound is polymerized or a preferred polymer is cross-linked by free radicals generated photochemically are well known in the art. The present invention is directed to the controlled production of inhibitor in the system so that hardening of the composition will not occur below a certain threshold of illumination, whereby resolution is enhanced.

Resolution is ordinarily measured as the number of line pairs per linear mm which can be resolved. For 1 line pair per mm, "lines" 0.5 mm in width are photohardened, separated by "lines" 0.5 mm in width of unhardened material which, for a photoresist film, must extend completely through the film thickness. Ordinarily the unhardened material will be removed by washing with water, an organic solvent or the like as described hereafter thereby leaving gaps between the hardened lines. Higher resolution implies a higher aspect ratio for the lines, where aspect ratio is equal to the height of the line divided by its width, or to 2tR, where R is the resolution in line pairs/mm and t is the height of the line in mm. Ordinarily the resolution is a function of film thickness, although not necessarily a linear function.

In the photohardening process radiation is normally absorbed to provide the initiating species. The amount of radiation available for the production of initiating species will, therefore, decrease progressively from the surface downwards. In the deeper layers of the composition, hardening will be correspondingly less rapid. At the same time, radiation will be scattered into nonilluminated areas by the film and by reflection from the substrate thus initiating hardening in those areas. Further, active initiating species can diffuse from illuminated to nonilluminated areas. These features tend to limit resolution.

Conventional inhibitors can improve resolution somewhat. This is because inhibitors destroy the initiating radicals until sufficient initiating radicals have been generated to completely consume the inhibitor, whereupon hardening will then proceed. Since the radiation entering nonilluminated areas by scattering, etc., generally has a lesser intensity than in the illuminated areas, the effect of the inhibition is greatest in such areas. The concentration of inhibitor necessary to prevent photohardening caused by scattered radiation is so high, however, that undesirable retardation of photohardening in the exposed area of the film occurs.

The present invention employs an inhibitor system wherein the inhibitor species (nitroso monomer) is produced continuously as it is consumed by dissociation of a noninhibiting species (nitroso dimer). The presence of inhibitor now depends on the relative rate of dissociation and rate of free-radical production. Thus there is created a threshold value of illumination for the effective production of free radicals to harden the composition. Below the threshold value in the nonilluminated areas inhibitor species are produced as fast as they are consumed by reaction with the active initiator radical. Thus hardening will be retarded for a prolonged period until all of the source of inhibiting species has been decomposed. Above the threshold value of illumination in the illuminated areas the small amount of inhibiting species present is removed faster than it can be produced, and hardening can proceed.

Another parameter that is significant with regard to the improved resolution capability of the film of photohardenable composition, is the film thickness. Since the free-radical generating system of the composition generates free radicals by absorbing radiation to which the system is sensitive, the film should not be so thick that the sensitizing radiation fails to penetrate the entire thickness of the directly illuminated area of the film with sufficient intensity that the entire thickness is photohardened. Generally, the thickness of the film is such that for the particular free-radical generating system and its concentration in the film, the film has an optical density no greater than about 1.25 to the transmitted radiation to which the system is sensitive. The optical densities disclosed herein are the mean optical density of the film to radiation in the spectral region in which the free-radical generating system absorbs radiation. On the other hand, since an effective amount of free-radical generating system must be present, the optical density of the film will be at least about 0.02. By proper balancing of the free-radical generating system, the nitroso dimer inhibitor source, thickness of the film, optical density of the film, and exposure intensity and time, improved resolution can be attained compared with prior art photohardenable compositions.

The photohardenable films of this invention contain a solvent-soluble, substantially solid organic composition capable of being rendered insoluble by free-radical initiated reaction. These solid organic compositions are preferably of the unsaturated compound/binder type containing at least one nongaseous, ethylenically unsaturated compound capable of forming a high polymer by free-radical initiated, chain-propagating addition polymerization and a macromolecular organic polymer as the binder. The particular nature of the unsaturated compound/binder system is not critical to this invention.

Suitable free-radical initiated, chain-propagating addition polymerizable, ethylenically unsaturated compounds include preferably an alkylene or a polyalkylene polyol triacrylate prepared from an alkylene polyol of 2 to 15 carbons or a polyalkylene ether polyol or glycol of 1 to 10 ether linkages, and the compounds disclosed by Martin and Barney in U.S. Pat. No. 2,927,022, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to heteroatoms such as nitrogen, oxygen and sulfur. Outstanding are such materials wherein the ethylenically unsaturated groups, especially the vinylidene groups, are conjugated with ester or amide structures.

The following specific compounds are further illustrative of this class: unsaturated esters of alcohols, preferably polyols, and particularly such esters of alphamethylene carboxylic acids, e.g., ethylene glycol diacrylate, diethylene glycol diacrylate, glycerol diacrylate, glycerol triacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol tetramethacrylate, 1,3-propanediol diacrylate, 1,3-pentanediol dimethacrylate, p-$\alpha,\alpha$-dimethylbenzylphenyl acrylate, the bis-acrylates and methacrylates of polyethylene glycols of molecular weight 200–500, and the like; unsaturated amides, particularly those of alphamethylene carboxylic acids, especially with alpha-omega-diamines and oxygen-interrupted omega-diamines, such as methylene bis-acrylamide, methylene bis-methacrylamide, ethylene bis-methacrylamide, 1,6-hexamethylene bisacrylamide, diethylene triamine trismethacrylamide, bis($\gamma$-methacrylamidopropoxy)ethane, beta-methacrylamidoethyl methacrylate, N-(beta-hydroxyethyl)-beta-(methacrylamido) ethyl acrylate, and N,N-bis(beta-methacryloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof; and unsaturated aldehydes, such as sorbaldehyde (hexanedienal).

An outstanding class of these preferred addition polymerizable components are the esters and amides of alphamethylene carboxylic acids and substituted alphamethylene carboxylic acids with polyols and polyamines wherein the molecular chain between the hydroxyls and amino groups is solely carbon or oxygen-interrupted carbon. The preferred unsaturated compounds are polyfunctional, but monofunctional compounds can also be used. In addition, the polymerizable, ethylenically unsaturated polymers of Burg, U.S. Pat. No. 3,043,805; Martin, U.S. Pat. No. 2,929,710; and similar materials may be used alone or mixed with other materials. Acrylic and methacrylic esters of polyhydroxy compounds such as pentaerythritol and trimethylolpropane, and acrylic and methacrylic esters of adducts of ethylene oxide and polyhydroxy compounds such as those described by Cohen and Schoenthaler in U.S. Pat. No. 3,380,831 are also useful. The photocrosslinkable polymers disclosed in Schoenthaler, U.S. Pat. No. 3,418,295; and Celeste, U.S. Pat. No. 3,448,089, may also be used. The amount of unsaturated compound added varies with the particular polymer used.

Suitable polymeric binders for use in the unsaturated compound/binder system have molecular weights of at least about 4,000 and are present in the amount of about 3–95% by weight and preferably about 25–75% by weight of the total film material. They include:

A. Copolyesters, e.g., those prepared from the reaction product of a polymethylene glycol of the formula HO(CH$_2$)$_n$OH, wherein n is a whole number from 2 to 10, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids, and (ii) terephthalic, isophthalic, sebacic and adipic acids;

B. Nylons or polyamides, e.g., N-methoxymethyl polyhexamethylene adipamide;

C. Vinylidene chloride copolymers, e.g., vinylidene chloride/acrylonitrile, vinylidene chloride/methacrylate, and vinylidene chloride/vinyl acetate copolymers;

D. Ethylene/vinyl acetate copolymers;

E. Cellulosic ethers, e.g., methyl cellulose, ethyl cellulose, and benzyl cellulose;

F. Polyethylene;

G. Synthetic rubbers, e.g., butadiene/acrylonitrile copolymers, and chloro-2-butadiene-1,3-polymers;

H. Cellulose esters, e.g., cellulose acetate, cellulose acetate succinate, and cellulose acetate butyrate;

I. Polyvinyl esters, e.g., polyvinyl acetate/acrylate, polyvinyl acetate/methacrylate, and polyvinyl acetate;

J. Polyacrylate and alpha-alkyl polyacrylate esters, e.g. polymethyl methacrylate, polyethyl methacrylate, polymethyl methacrylate/acrylic acid, and polymethyl methacrylate/methacrylic acid;

K. High molecular weight polyethylene oxides of polyglycols having average molecular weights from 4,000 to 1,000,000;

L. Polyvinyl chloride and copolymers, e.g., polyvinyl chloride/acetate;

M. Polyvinyl acetal, e.g., polyvinyl butyral and polyvinyl formal;

N. Polyformaldehyde;

O. Polyurethanes;

P. Polycarbonates; and

Q. Polystyrenes.

A preferred group of binders includes the polyacrylates and α-alkylacrylate esters, particularly polymethyl methacrylate.

Although thermoplastic binders are normaly and preferably employed, there can be added in addition to or instead of said binders nonthermoplastic polymeric compounds to improve certain desirable characteristics, e.g., adhesion to the base support, adhesion to the image-receptive support on transfer, wear properties, chemical inertness, etc. Suitable nonthermoplastic polymeric compounds include polyvinyl acohol, cellulose, anhydrous gelatin, phenolic resins and melamine-formaldehyde resins, etc. If desired, the photohardenable layers can also contain immiscible polymeric or nonpolymeric organic or inorganic fillers or reinforcing agents which are essentially transparent at the wavelengths used for the exposure of the photohardenable material, e.g., the organophilic silicas, bentonites, silica, powder glass, colloidal carbon, as well as various types of dyes and pigments. Such materials are used in amounts varying with the desired properties of the photohardenable layers. The fillers are useful in improving the strength of the compositions, reducing tack and in addition, as coloring agents.

When the polymer is a hard, high-melting compound, a plasticizer may be used to lower the glass transition temperature and facilitate selective development. The plasticizer may be any of the common plasticizers compatible with the polymeric binder. Among the common plasticizers are dialkyl phthalates, alkyl phosphates, polyethylene glycol, polyethylene glycol esters, and polyethylene glycol ethers.

The inhibitor source of the present invention is at least one dimeric nitroso compound containing a dinitroso group which is a noninhibitor of free-radical polymerization but dissociates to a nitroso monomer which is an inhibitor of free-radical polymerization. The nitroso dimer contains a dinitroso group, for example of the structure $$\begin{array}{c} O \\ \uparrow \\ -N=N- \\ \downarrow \\ O \end{array} \quad \text{or} \quad \begin{array}{c} O \\ \uparrow \\ =N-O-N= \end{array}.$$

The structure of the remainder of the compound is not important provided it does not contain groups which inhibit free-radical polymerization. The actual configuration of dinitroso groups of the first type, whether cis or trans, is immaterial, but the configuration is believed to be mainly trans except when constrained to the cis configuration by a ring structure.

The dinitroso group of the dimer is stable to free radicals, but does thermally dissociate to nitroso monomer having one or more —NO groups. It is the —NO group in the monomer that is reactive with free radicals thereby consuming them. Thus, it is apparent that the organic groups satisfying the valences of the dinitroso group and the organic group present in the nitroso monomer are not critical. The organic groups bonded to the nitroso dimer group to determine the dissociation constant and/or dissociation rate of the dimer to nitroso monomer. Once in the monomer form, however, it is the presence of the —NO group only that is important. As such one merely chooses the organic groups that give the dissociation character desired for the dimer.

The nitroso dimers used in accordance with this invention are characterized by (1) a dissociation constant of about $10^{-2}$–$10^{-10}$ in solution at 25° C., and (2) a rate of dissociation having a half-life comparable with the exposure times employed, i.e., about 0.5–30 minutes or more in solution at the operating temperature.

The dissociation half-life of the dimer can be determined using known techniques, for example, by measuring the rate of colored nitroso monomer formation by visible spectroscopy.

A typical nitroso dimer of the first structure thermally dissociates in accordance with the equation:

$$\underset{S}{\bigcirc}-\underset{\substack{\uparrow \\ \downarrow \\ O}}{N=N}-\underset{S}{\bigcirc} \rightleftharpoons 2\ \underset{S}{\bigcirc}-NO$$

The nitroso monomer may contain one or more nitroso groups. When the nitroso monomer contains two or more nitroso groups, the association of the nitroso groups in the nitroso dimer may be intramolecular rather than intermolecular.

A typical nitroso dimer of the first structure having an intramolecular association of the nitroso groups thermally dissociates in accordance with the equation:

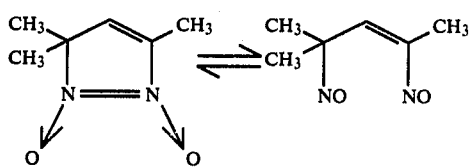

A typical nitroso dimer of the second structure thermally dissociates in accordance with the equation:

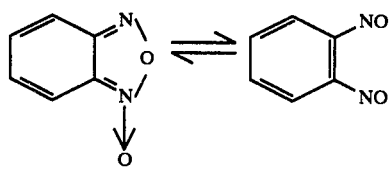

In general, nitroso dimers have nitroso groups attached to primary or secondary aliphatic or alicyclic carbon atoms, and some aliphatic or alicyclic nitroso compounds wherein the nitroso group is attached to a tertiary carbon atom are suitable. Also suitable are certain dinitroso compounds in which at least one of the nitrogen atoms, in the noninhibitor or inhibitor form, is attached to a 6-membered aromatic ring or to the beta carbon of a vinyl group attached to a 6-membered aromatic ring. These compounds are referred to herein, for simplicity, as aromatic nitroso dimers. The nitroso dimer should have a relatively low molecular weight, i.e., the nitroso monomer preferably has not more than about 20 carbon atoms.

Suitable examples of nitroso dimers include:

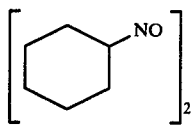

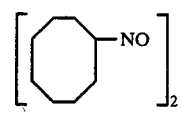

(n-C₃H₇CH(NO)C₃H₇)₂

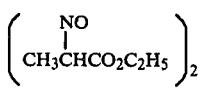

(C₂H₅CHCO₂C₂H₅)₂
  |
  NO ((CH₃)₂CHNO)₂

(CH₃CH(NO)C₂H₅)₂

(n-C₄H₉CH(NO)CO₂C₂H₅)₂

((CH₃)₂CHCH₂CH₂CH(NO)CO₂C₂H₅)₂

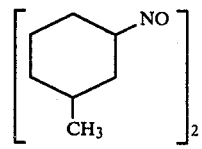

(C₂H₅O₂CCH₂CH(NO)CO₂C₂H₅)₂
(CH₃COCH(CO₂C₂H₅)CH(NO)CO₂C₂H₅)₂

(CH₃COCH(NO)COC₆H₅)₂

((CH₃)₂CHCH(NO)CH₃)₂

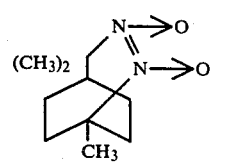

(C₆H₅COCH(NO)COC₆H₅)₂

(p-CH₃OC₆H₄COCH(NO)COC₆H₅)₂

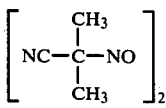

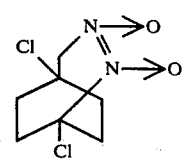

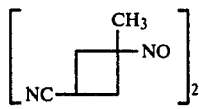
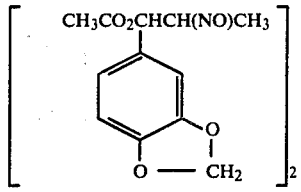
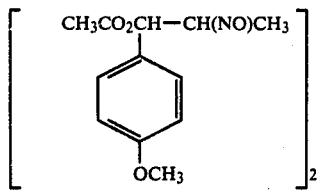
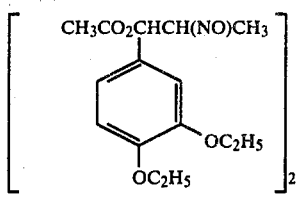
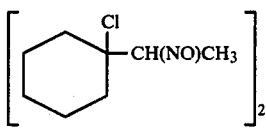
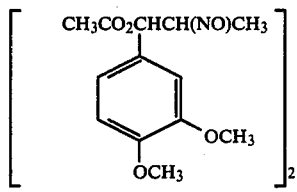
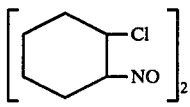
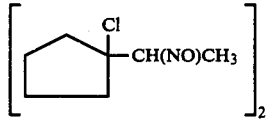
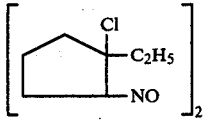
(n-C$_4$H$_9$CH(NO)CH$_2$CH$_2$CH$_2$OH)$_2$
(n-C$_6$H$_{13}$CH(NO)CH$_3$)$_2$
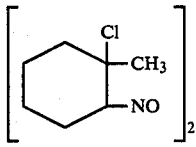
(CH$_3$CH(NO)Cl)$_2$
(HO(CH$_2$)$_6$NO)$_2$
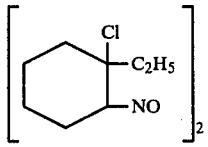
((CH$_3$)$_3$CCH$_2$CH(NO)C(CH$_3$)$_2$ONO$_2$)$_2$
(CH$_3$CH(Cl)CH(NO)CH$_3$)$_2$
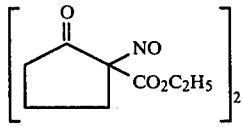
(CH$_3$CH(Cl)CH(NO)C$_2$H$_5$)$_2$ (C₆H₅CH(Cl)CH(NO)CH₃)₂
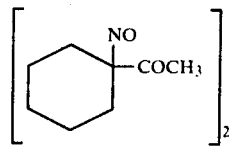
((CH₃)₂C(Cl)CH(NO)CH₃)₂
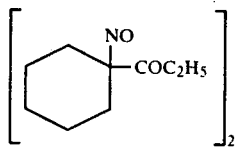
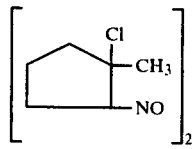
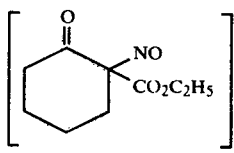
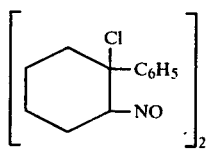
(C₂H₅COC(CH₃)(NO)CH₃)₂
((CH₃)₂CHCOC(CH₃)(NO)CH₃)₂
(CH₃COC(CH₃)(NO)CH₃)₂
((CH₃)₂CHCH₂COC(CH₃)(NO)CH₃)₂
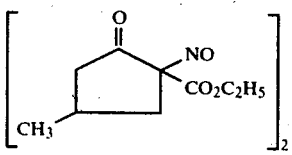
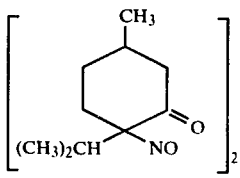
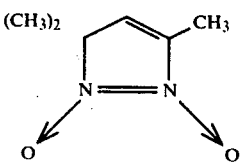
(C₆H₅COC(CH₃)(NO)CO₂C₂H₅)₂
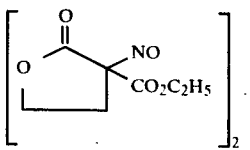
([(CH₃)₃C]₂CHNO)₂
(CH₃C(CH(CH₃)₂)₂CH₂NO)₂
(CH₃(CH₂)₁₆CH₂NO)₂
(CH₃(CH₂)₁₀CH₂NO)₂
(CH₃NO)₂
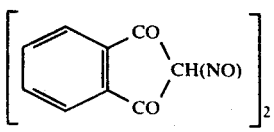
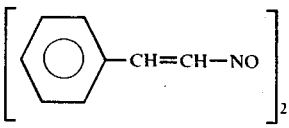

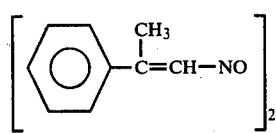
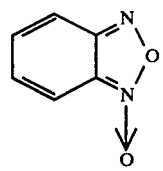
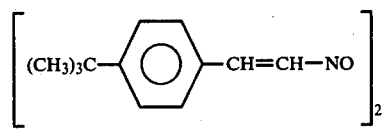
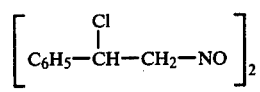
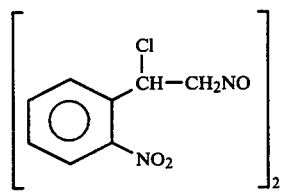
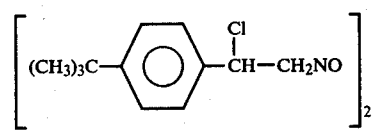
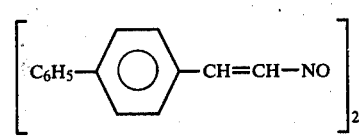
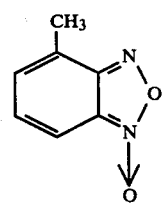
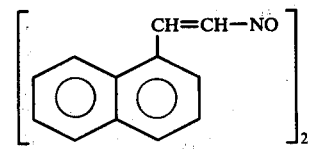
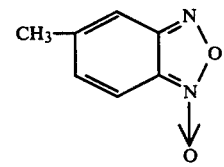
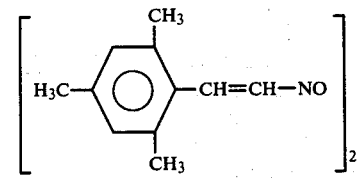

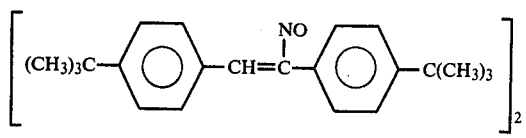

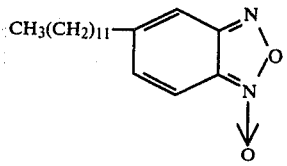

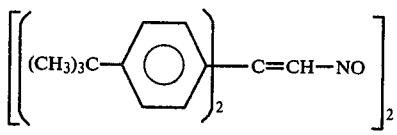

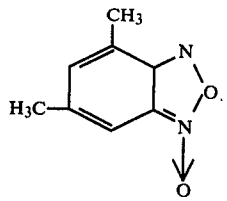

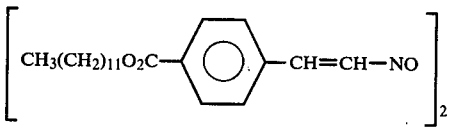

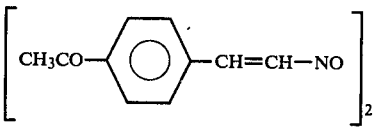

The concentration of nitroso dimer in the system is critical and should be about 0.04-3% by weight, preferably about 0.1-2% by weight, and most preferably about 0.3-1.5% by weight based on the total film material. The concentrations of nitroso dimer disclosed herein are based on the amount of dimer added to the photohardenable composition, disregarding the small proportion of dissociation to monomer that occurs.

The composition also contains an organic, radiation-sensitive free-radical generating system which initiates polymerization of the unsaturated compound and does not subsequently terminate the polymerization. The word "organic" is used here and in the claims to designate compounds which contain carbon, and one or more of oxygen, hydrogen, nitrogen, sulfur and halogen, but no metal. The photoinitiator should be activated by exposure to relatively long wavelengths at which the nitroso dimers do not absorb any substantial amount of radiation, i.e., which can be activated by wavelengths greater than about 3400Å. Shorter wavelengths cause photodissociation of the nitroso dimer, which is undesirable. When aromatic nitroso dimers are employed, activating radiation having a wavelength higher than about 3800Å should be employed to avoid photodissociation of the nitroso dimer. The free-radical generating system should have at least one component that has an active radiation absorption band with a molar extinction coefficient of at least about 50 within the range of about 3400-8000Å, preferably about 3400-5000Å. "Active radiation absorption band" means a band of radiation which is active to produce the free radicals necessary to initiate polymerization of the unsaturated material. The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such compounds can be utilized in the practice of the invention and include aromatic ketones such as benzophenone, Michler's ketone (4,4'-bis(-dimethylamino)benzophenone), 4,4'-bis(diethylamino)-benzophenone, 4-acryloxy-4'-dimethylaminobenzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, and other aromatic ketones; benzoin, benzoin ethers such as benzoin methyl ether, benzoin ethyl ether and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl)-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like disclosed in U.S. Pat. Nos. 3,479,185 and 3,784,557 and in British Pat. Nos. 997,396, published July 7, 1965, and 1,047,569, published Nov. 9, 1966.

The imidazolyl dimers are used with a free-radical producing electron donor such as 2-mercaptobenzoxazole, leuco crystal violet or tris(4-diethylamino-2-methylphenyl)methane, which is preferred. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863. The preferred initiating systems employ triarylimidazolyl dimers and a free-radical producing electron donor, with or without the use of sensitizing compounds as described in U.S. Pat. No. 3,479,185 to Chambers. The 2,4,5-triphenylimidazolyl dimers having an ortho substituent on the 2-phenyl ring are particularly useful as components of the initiating system because of their stability. Such dimers are 2-(o-chlorophenyl)-4,5-diphenylimidazolyl dimer, 2-(o-fluorophenyl)-4,5-diphenylimidazolyl dimer, or 2-(o-methoxyphenyl)-4,5-diphenylimidazolyl dimer.

An important aspect of the present invention is that the mean optical density of the film over the range of wavelengths employed for activators should be about 0.02–1.25, and preferably about 0.24–0.51. This is to insure that sufficient radiation will penetrate the film to accomplish photohardening in the presence of the inhibitor sources of this invention.

The initiating systems operate by the absorption of radiation and are preferably the sole absorbing species in the range of the wavelengths used for initiation. Accordingly, the concentration of initiator and/or sensitizer are normally adjusted to the particular film thickness employed. For example with films of about 0.5 mil (0.00127 cm) in thickness the use of Michler's ketone in conjunction with a 2,4,5-triarylimidazolyl dimer system is desirable. However, Michler's ketone is relatively highly absorbing and when films of 10 mils (0.0254 cm) or greater are employed, it is preferred to employ the 2,4,5-triarylimidazolyl dimer system without or with very little added Michler's ketone or other highly absorbing sensitizer.

Subject to the aforesaid limitations of optical density, the initiator system and sensitizer are present in amounts from about 1.0–10% by weight based on the total film material in the composition. The nitroso dimer compounds absorb only minor amounts of radiation, <0.1%, in the range of the wavelengths employed to effect initiation.

As is known from the work of Donaruma, J. Org. Chem., 23, 1338 (1958), applied to nitrosocyclohexane dimer, isomerization of nitroso dimers to oximes is catalyzed by acids and bases. Certain of the photohardenable compositions of this invention have been found to undergo changes on storage whereby the high resolution, obtainable with these compositions as originally prepared, in some instances is no longer obtainable. This phenomenon has been observed, for example, when purified methylene chloride, which has had the trace amount of acid normally present in reagent grade material removed, is employed as a coating solvent. Such deterioration is particularly noticeable when the composition includes a component containing a basic amino group. Components which could contain an amino group include the unsaturated compound, any polymeric binder employed, one or more of the components of the free-radical generating system, or any additional components such as plasticizers, adhesion promoters, etc. It has been found that neutralization of all or a portion of the basic amino groups with a suitable acid prevents deterioration of the composition, whereby, even after storage for several months, this composition, after exposure and subsequent development, gives an image with resolution equivalent to that obtained with a freshly prepared composition.

For neutralization of these amino groups, it is preferred to employ a mineral or organic acid with a dissociation constant in aqueous solution greater than about $1.3 \times 10^{-5}$. Dissociation constants of organic and inorganic acids in aqueous solution can be found, e.g., in the "Handbook of Chemistry and Physics", 55th Edition 1974–1975, D129-D130, CRC Press Inc., Cleveland, Ohio. The preferred acid is trifluoroacetic acid because of the good coating characteristics of the resulting compositions.

The amount of acid necessary to provide shelf stability for the composition will depend upon the concentration of amino groups in the composition. About 0.25 to about 1.0 mole of acid per mole of amino group is usually satisfactory, and preferably about 0.33 to about 0.67 mole per mole. When reagent grade methylene chloride is employed as a coating solvent, it is usually not necessary to add acid, since a trace amount of acid is normally present in this solvent.

The photohardenable compositions are used in the form of films which may be supplied on a wide variety of substrates and protected by suitable coatings. By "substrate" is meant any natural or synthetic support, preferably one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include copper, alumina-blasted aluminum, oriented polyester film, alumina-blasted oriented polyester film, polyvinylidene chloride-coated oriented polyester film, polyvinyl alcohol-coated paper, cross-linked polyestercoated paper, nylon, glass, heavy paper such as lithographic paper, polypropylene film and the like. The preferred substrate is copper.

The photohardenable compositions are preferably applied to substrates and formed into films by processes which do no employ heat. Deposition from solution is preferred. Suitable solvents are shown in the accompanying examples and others will be apparent to those skilled in the art.

The photohardenable compositions can serve as photoresists in making etched or plated circuits or in chemical milling applications. For example, the photopolymerizable composition may be applied in liquid form to a substrate followed by drying. A removable cover sheet may be applied to the surface of the resultant layer of the composition in order to protect it during handling. Upon removing the cover sheet if present, the dry layer can be laminated to another substrate for its ultimate use, using conventional laminating equipment to apply pressure and generally using heat. The original substrate now becomes a cover sheet. This technique is particularly useful in applying the compositions for use as photoresists, such as described in U.S. Pat. No. 3,469,982, wherein the original substrate is a polymeric film and the substrate to which the layer is transferred generally has a metal or ceramic surface.

Photohardening is accomplished by exposure to radiation preferably having a wavelength range between about 3400Å and 5000Å, and between about 3800Å and 5000Å when aromatic-type nitroso dimers are employed. Shorter wavelengths which photodissociate the nitroso dimer should be present in only minor amounts. Suitable sources of such radiation, in addition to sunlight, include carbon arcs, mercury-vapor arcs, fluorescent lamps with ultraviolet-radiation-emitting phosphors, argon glow lamps, electronic flash units and photographic flood lamps. Electron accelerators and electron beam sources through an appropriate mask may also be used.

The energy density of illumination should be between 200 and 2000 $\mu w/cm^2$ and preferably from 400–1000 $\mu w/cm^2$. The optimum energy density and time of exposure to achieve maximum resolution will depend on temperature and the particular nitroso dimer present. The above ranges are suitable for the disclosed nitroso dimers at about ambient temperature, i.e., about 20°–35°

C. At higher or lower temperatures the equilibrium constant and rate of dissociation of the nitroso dimer will differ, both increasing with increasing temperature. This is offset, however, by an increasing rate of polymerization. Exposure temperatures are not particularly critical so long as the equilibrium concentration of nitroso monomer remains at a low level. Hence temperatures below about 45° C. are used.

Imagewise exposure, for example in preparing printing plates, is conveniently carried out by exposing a layer of the photopolymerizable composition to radiation through a process transparency, for example a process negative or positive; that is, an image-bearing transparency consisting solely of areas substantially opaque and substantially transparent to the radiation being used, where the opaque areas are substantially of the same optical density; for example, a so-called line or halftone negative or positive. Process transparencies may be constructed of any suitable materials including cellulose acetate film and oriented polyester film.

After exposure the image may be developed by toning, i.e., dusting with a fine pigment which selectively adheres to the tacky unhardened areas. Generally the portions of the film corresponding to the unexposed portions are removed, e.g., in photoresist applications. In view of the improved resolution and the accompanying increase in aspect ratio, care must be employed to achieve the best results. A preferred method of removing the unhardened material is to employ a suitable solvent applied by an air spray. The use of an air spray rather than the conventional method of spraying liquid solvents enables advantage to be taken of the high resolution achieved with the films of the present invention.

Other uses for the films of the present invention will be evident to those skilled in the art. Specific uses are disclosed in U.S. Pat. Nos. 2,760,863; 3,060,023; 3,469,982 and 3,060,026.

The following examples illustrate specific embodiments of the invention.

Coating solutions were prepared by dissolving the reactants in reagent grade methylene chloride at 25° C. The solutions were coated with a doctor knife onto "one oz." (28 g) copper-clad circuit board. The copper surfaces of the boards were cleaned with pumice powder and water just before coating with photopolymer solutions. The coatings were dried at 25° C., and those coatings so identified were coated with a 1% polyvinyl alcohol solution (Elvanol® 51-05) in water using a cotton ball dampened with the polymer solution. Coating thicknesses (dried) of these top coats were were ≦0.05 mil (0.000127 cm).

Samples were exposed in a glass vacuum frame (nuArc Co.) at 1 mm pressure to a 275 W sunlamp held 17 in (43.2 cm) away from the sample, except as noted. The system was evacuated for 2 minutes prior to exposure and during the exposure. Itek Corp. silver image film transparencies of a 1951 Air Force Test pattern (resolution of the bar patterns to 228 line pairs/mm) were used with the emulsion side of the patterns in contact with the photohardenable coatings. Immediately after exposure, the samples were washed with cold water to remove the polyvinyl alcohol coatings and then spray developed (unless otherwise noted) using methyl chloroform in a spray gun held two inches (5.1 cm) from the samples. The developed samples were examined optically to determine the highest resolution elements which were washed out completely to the copper base of the sample.

EXAMPLE 1

A stock solution of a mixture of 1.45 g of trimethylolpropane triacrylate containing 245 ppm of hydroquinone inhibitor, 0.44 g of conventional plasticizers, 0.22 g of triethyleneglycol diacetate, 2.62 g of polymethyl methacrylate resin, 0.20 g of 2-o-chlorophenyl-4,5-diphenylimidazolyl dimer, 0.05 g of Michler's ketone, 0.015 g of tris-(4-diethylamino-2-methylphenyl)methane, and 0.01 g of an adhesion promoter dissolved in 20 ml of methylene chloride was prepared. One-quarter of this solution was coated onto a copper-clad circuit board, and the solvent was evaporated at 25° C. The coating was 1.3 mils (.0033 cm) thick and it was subsequently top-coated with polyvinyl alcohol solution to a thickness of 0.05 mil (.000127 cm). This control sample was coded A.

Coating B was prepared from ¼ of the stock solution to which 0.02 g of nitrosocyclohexane dimer was added. Coating C was prepared from ¼ of the stock solution plus 0.01 g of nitrosocyclohexane dimer.

After exposure and development as described, the highest resolution elements were determined for each plate. The results are tabulated in Table I. Addition of nitrosocyclohexane dimer gave markedly improved resolution as indicated by the greater number of line pairs that could be observed in the photopolymer relief image formed from coatings B and C.

TABLE I

| Sample | Exposure Time, (Min.) | Resolution (line pairs/mm) |
|---|---|---|
| A (control) | 6 | 14.3 |
| A | 9 | 12.7 |
| A | 10 | 11.3 |
| B | 30 | 22.5 |
| B | 35 | 16.0 |
| B | 40 | 40.0 |
| C | 15 | 14.3 |
| *C | 20 | 28.5 |
| C | 25 | 20.0 |

*This same resolution was obtained when a Corning 0-52 filter was used to remove radiation of λ <3400Å.

The optical density of a 1.3 mil (.0033 cm) coating, prepared from ¼ of the stock solution to which 0.015 g of nitrosocyclohexane dimer was added, was determined. The radiation output from the sunlamp was passed through a neutral density filter, a Corning 7-51 filter, a wire mesh attenuation screen and a ¼ in (0.635 cm) quartz plate, and the intensity measured with a photocell was 0.52 μamp/cm². The transmitted radiation intensity through the coating, coated on the ¼ in quartz plate, was 0.04 μamp/cm² corresponding to a transparency of 0.077 and an optical density of 1.11.

EXAMPLE 2

A stock solution was prepared with the same quantities of ingredients as in Example 1 except that one-tenth the quantity (0.005 g) of Michler's ketone was used. One-quarter of this solution was coated onto a copper-clad circuit board as described in Example 1. The final coating was 1.3 mils (0.0033 cm) in thickness and it was subsequently top-coated with a polyvinyl alcohol solution to a thickness of 0.05 mil (0.000127 cm). This control sample was coded A. An additional coating, coded B, was prepared from one-quarter of the stock solution to which 0.015 g of nitrosocyclohexane dimer was added.

After exposure and development as described, the highest resolution elements were determined for each plate. The results are tabulated in Table II. Addition of nitrosocyclohexane dimer at reduced Michler's ketone level gave markedly improved resolution.

TABLE II

| Sample | Exposure Time, (Min.) | Resolution (line pairs/mm) |
|---|---|---|
| A (control) | 2 | 10 |
| A | 6 | 9 |
| A | 12 | 4 |
| B | 12 | 64 |
| B | 16 | 64 |
| B | 20 | 80 |
| B | 28 | 57 |

The optical density of a coating composition identical to B was measured as described in Example 1. The transmitted radiation intensity was 0.21 μamp/cm², corresponding to a transparency of 0.404 and an optical density of 0.39.

EXAMPLE 3

A stock solution was prepared as follows:
1.45 g of trimethylolpropane triacrylate
0.44 g of conventional plasticizers
0.22 g of triethyleneglycol diacetate
2.62 g of polymethyl methacrylate resin
0.01 g of adhesion promoter
0.20 g of 2-o-chlorophenyl-4,5-diphenylimidazol dimer
0.03 g of tris(4-diethylamino-2-methylphenyl)methane
20 ml of methylene chloride One-quarter of this solution was coated onto a copper-clad circuit board, and the solvent was evaporated at 25° C. to leave a photohardenable resist layer, 10 mils (0.0254 cm) in thickness. This control sample was coded A. Other similarly coated boards, 10 mils (0.0254 cm) in thickness, were prepared from solutions B, C and D, prepared as follows:

B: ¼ of the stock solution +0.006 g of nitrosocyclohexane dimer +0.0012 g of Michler's ketone
C: ¼ of the stock solution +0.01 g of nitrosocyclohexane dimer
D: ¼ of the stock solution +0.003 g of nitrosocyclohexane dimer +0.0004 g of Michler's ketone.

The coated boards were exposed to a 100 W AH 4 medium pressure mercury lamp (Westinghouse) held 4 in (10.16 cm) away from the sample, and they were subsequently developed as described. The highest resolution elements were determined for each plate, and the results are tabulated in Table III. The use of nitroso dimer without Michler's ketone gives the highest resolution in this system.

TABLE III

| Sample | Exposure Time, (Sec.) | Resolution (line pairs/mm) |
|---|---|---|
| A (control) | 10 | 10.0 |
| A | 70 | 7.1 |
| A | 180 | 10.0 |
| A | 300 | 1.4 |
| B | 70 | 5.1 |
| B | 90 | 5.7 |
| B | 300 | 1.6 |
| C | 240 | 5.1 |
| C | 480 | 16.0 |
| C | 600 | 18.0 |
| C | 720 | 16.0 |
| D | 20 | 10 |
| D | 35 | 8 |
| D | 50 | 11.3 |

TABLE III-continued

| Sample | Exposure Time, (Sec.) | Resolution (line pairs/mm) |
|---|---|---|
| D | 300 | 7.1 |

EXAMPLE 4

A stock solution was prepared as described in Example 2A above. The following solutions were prepared from it.

A: ¼ of the stock solution +0.005 g of nitrosocyclohexane dimer
B: ¼ of the stock solution +0.010 g of nitrosocyclohexane dimer
C: ¼ of the stock solution +0.015 g of nitrosocyclohexane dimer
D: ¼ of the stock solution +0.020 g of nitrosocyclohexane dimer Each solution was used to coat two copper-clad circuit boards as described in Example 1 with final coating thicknesses of 3 mils (0.00762 cm) and 5 mils (0.0127 cm) respectively.

After exposure and development as described, the highest resolution elements were determined for each plate, and the results are tabulated in Table IV. Resolution increases as a function of nitroso dimer concentration.

TABLE IV

| Sample | Thickness, (mils) | Exposure Time, (min.) | Resolution (line pairs/mm) |
|---|---|---|---|
| A | 5 | 40 | 8 |
| A | 5 | 30 | 22.5 |
| A | 5 | 25 | 12.7 |
| A | 5 | 15 | 28.5 |
| A | 3 | 40 | 7.1 |
| A | 3 | 30 | 14.3 |
| A | 3 | 25 | 28.5 |
| A | 3 | 15 | 28.5 |
| B | 5 | 40 | 18 |
| B | 5 | 30 | 22.5 |
| B | 5 | 25 | 40 |
| B | 5 | 15 | 28.5 |
| B | 5 | 10 | 51 |
| B | 3 | 40 | 22.5 |
| B | 3 | 30 | 32 |
| B | 3 | 25 | 40 |
| B | 3 | 15 | 32 |
| B | 3 | 10 | 45 |
| C | 5 | 30 | 40 |
| C | 5 | 25 | 40 |
| C | 5 | 20 | 45 |
| C | 5 | 18 | 40 |
| C | 5 | 10 | 22.5 |
| C | 3 | 30 | 57 |
| C | 3 | 25 | 45 |
| C | 3 | 20 | 40 |
| C | 3 | 18 | 57 |
| C | 3 | 10 | 40 |
| D | 5 | 30 | 20 |
| D | 5 | 20 | 40 |
| D | 5 | 18 | 57 |
| D | 5 | 15 | 36 |
| D | 5 | 10 | 51 |
| D | 3 | 30 | 20 |
| D | 3 | 20 | 51 |
| D | 3 | 18 | 51 |
| D | 3 | 15 | 36 |
| D | 3 | 10 | 51 |

EXAMPLE 5

The following stock solution was prepared:
2.90 g of trimethylolpropane triacrylate 0.88 g of conventional plasticizers
0.44 g of triethyleneglycol diacetate
5.24 g of polymethyl methacrylate resin
0.01 g of Michler's ketone
0.03 g of tris(4-diethylamino-2-methylphenyl)methane
0.40 g of 2-o-chlorophenyl-4,5-diphenylimidazolyl dimer
0.02 g of adhesion promoter
40 ml of methylene chloride One-eighth of this solution was coated onto a copper-clad circuit board, and the solvent was evaporated at 25° C. to leave a photohardenable resist layer, 1.3 mils (0.0033 cm) in thickness. The layer was top-coated with polyvinyl alcohol solution to a thickness of 0.05 mil (0.000127 cm). This control sample was coded A. Other similarly coated boards, 1.3 mils (0.0033 cm) in thickness, were prepared from solutions B, C and D, prepared as follows:

B: ⅛ of the stock solution+0.01 g of [(CH₃)₃C]₂CHNO dimer

C: ⅛ of the stock solution+0.01 g of

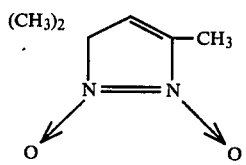

D: ⅛ of the stock solution+0.015 g of

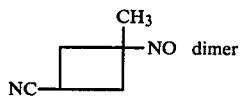

After exposure and development as described, the highest resolution elements were determined for each plate, and the results are tabulated in Table V.

TABLE V

| Sample | Exposure Time (Min.) | Resolution (line pairs/mm) |
| --- | --- | --- |
| A (control) | 0.5 | 40 |
| A | 1.0 | 45 |
| A | 1.5 | 36 |
| A | 2.0 | 32 |
| B | 1.5 | 45 |
| B | 2.0 | 45 |
| B | 2.5 | 64 |
| B | 3 | 72 |
| B | 4 | 40 |
| B | 6 | 32 |
| B | 8 | 32 |
| B | 10 | 23 |
| C | 1.5 | 45 |
| C | 2.0 | 57 |
| C | 2.5 | 40 |
| C | 3.0 | 64 |
| C | 4.0 | 29 |
| D | 4 | 36 |
| D | 4.5 | 36 |
| D | 5.0 | 45 |
| D | 5.5 | 40 |
| D | 6.0 | 36 |
| D | 6.5 | 32 |
| D | 8.0 | 25 |
| D | 10.0 | 18 |

EXAMPLE 6

The stock solution of Example 5 was prepared, and one-eighth of this solution was coated onto a copper-clad circuit board as described in Example 5. This control sample was coded A. Other similarly coated boards also 1.3 mils (0.0033 cm) in thickness, were prepared from solutions B, C, D and E, prepared as follows:

B: ⅛ of the stock solution+0.015 g of HO(CH₂)₆NO dimer

C: ⅛ of the stock solution+0.015 g of (CH₃)₃CCH₂CH(NO)C(CH₃)₂ONO₂ dimer

D: ⅛ of the stock solution+0.015 g of nitrosocyclohexane dimer

E: ⅛ of the stock solution+0.015 g of [(CH₃)₃C]₂CHNO dimer

After exposure and development as described, the highest resolution elements were determined for each plate, and the results are tabulated in Table VI.

TABLE VI

| Sample | Exposure Time, (Min.) | Resolution (line pairs/mm) |
| --- | --- | --- |
| A (Control) | 0.33 | 36 |
| A | 0.50 | 40 |
| A | 0.67 | 45 |
| A | 1.0 | 25 |
| A | 1.5 | 23 |
| A | 2.0 | 13 |
| B | 1.0 | 25 |
| B | 2.0 | 72 |
| B | 4 | 90 |
| B | 6 | 72 |
| B | 8 | 45 |
| B | 9 | 36 |
| B | 12 | 32 |
| C | 2 | 64 |
| C | 4 | 36 |
| C | 6 | 32 |
| C | 8 | 40 |
| D | 2 | 40 |
| D | 4 | 90 |
| D | 6 | 72 |
| D | 9 | 64 |
| D | 12 | 40 |
| D | 15 | 32 |
| E | 2 | 32 |
| E | 4 | 45 |
| E | 6 | 45 |
| E | 8 | 36 |
| E | 12 | 51 |
| E | 15 | 45 |

EXAMPLE 7

A stock solution was prepared as follows:
1.76 g of conventional plasticizers
0.88 g of triethylene glycol diacetate
10.48 g of polymethyl methacrylate resin
0.06 g of tris(4-diethylamino-2-methylphenyl)methane
0.80 g of 2-o-chlorophenyl-4,5-diphenylimidazolyl dimer
0.02 g of Michler's ketone
0.04 g of adhesion promoter
80 ml of methylene chloride To 1/16 of this solution was added 0.36 g of 1,4-benzenedimethanol diacrylate and the solution was coated onto a copper-clad circuit board. The solvent was evaporated at 25° C. to leave a photohardenable resist layer, 1.3 mils (0.0033 cm) in thickness, which was subsequently top-coated with polyvinyl alcohol solution. This control sample was coded A. Other similarly coated boards were prepared from solutions B, C, and D which were prepared as follows:

B: 1/16 of the stock solution+0.37 g of 1.4-benzenedimethanol diacrylate+0.015 g of nitrosocyclohexane dimer
C: 1/16 of the stock solution+0.36 g of p-α,α-dimethylbenzylphenyl acrylate
D: 1/16 of the stock solution+0.36 g of p-α,α-dimethylbenzylphenyl acrylate+0.015 g of nitrosocyclohexane dimer.

The boards were exposed as described, and washout was carried out using methyl chloroform in a spray gun held 2 in (5.08 cm) from the samples. The highest resolution elements were determined for each plate, and the results are tabulated in Table VII.

TABLE VII

| Sample | Exposure Time (Min.) | Resolution (line pairs/mm) |
|---|---|---|
| A (control) | 0.08 | 16 |
| A | 0.17 | 18 |
| A | 0.25 | 14 |
| A | 0.33 | 13 |
| A | 0.50 | 8 |
| B | 0.17 | 20 |
| B | 0.33 | 51 |
| B | 1.0 | 40 |
| B | 4.0 | 29 |
| B | 6.0 | 18 |
| C | 0.50 | 18 |
| C | 0.75 | 45 |
| C | 1.0 | 36 |
| C | 1.25 | 36 |
| C | 2.0 | 29 |
| D | 1.0 | 11 |
| D | 2.0 | 57 |
| D | 5.0 | 51 |
| D | 15.0 | 40 |

EXAMPLE 8

A stock solution was prepared as follows:
2.90 g of trimethylolpropane triacrylate
4.08 g of polymethyl methacrylate/methacrylic acid resin
0.49 g of conventional plasticizers
0.03 g of tris(4-diethylamino-2-methylphenyl)methane
0.40 g of 2-o-chlorophenyl-4,5-diphenylimidazolyl dimer
0.01 g of Michler's ketone
0.02 g of adhesion promoter
32 ml of methylene chloride+8 ml of 2-ethoxyethanol One-eighth of this solution was coated onto a copper-clad circuit board, and the solvent was evaporated to leave a 1.3 mil (0.0033 cm) resist layer. The layer was subsequently top-coated with polyvinyl alcohol solution, and this control sample was coded A. Another similarly coated board was prepared from solution B which was prepared as follows:
B: ⅛ of the stock solution+0.01 g of nitrosocyclohexane dimer.

After exposure and development as described in Example 7, the highest resolution elements were determined for each plate, and the results are tabulated in Table VIII.

TABLE VIII

| Sample | Exposure Time (min.) | Resolution (line pairs/mm) |
|---|---|---|
| A (control) | 0.17 | 18 |
| A | 0.33 | 25 |
| A | 0.50 | 25 |
| A | 0.83 | 18 |
| A | 1.0 | 14 |
| A | 2.0 | 7 |
| B | 0.17 | 16 |
| B | 0.33 | 40 |
| B | 0.50 | 57 |
| B | 1.0 | 40 |
| B | 2.0 | 23 |
| B | 3.0 | 18 |

EXAMPLE 9

A stock solution was prepared as follows:
2.90 g of trimethylolpropane triacrylate
0.88 g of conventional plasticizers
0.49 g of triethylene glycol diacetate
5.24 g of polymethyl methacrylate/acrylonitrile/butadiene/styrene resin
0.03 g of tris(4-diethylamino-2-methylphenyl)methane
0.40 g of 2-o-chlorophenyl-4,5-diphenylimidazolyl dimer
0.01 g of Michler's ketone
0.02 g of adhesion promoter
40 ml of methylene chloride One-eighth of this solution was coated onto a copper-clad circuit board, and the solvent was evaporated to leave a 1.3 ml (0.0033 cm) photohardenable resist layer. The layer was subsequently top-coated with polyvinyl alcohol solution, and this control sample was coded A. Another similarly coated board was prepared from solution B which was prepared as follows:
B: ⅛ of the stock solution +0.01 g of nitrosocyclohexane dimer.

After exposure and development as described in Example 7, the highest resolution elements were determined for each plate, and the results are tabulated in Table IX

TABLE IX

| Sample | Exposure Time (min.) | Resolution (line pairs/mm) |
|---|---|---|
| A (control) | 3.0 | 7 |
| A | 3.5 | 14 |
| A | 4.0 | 29 |
| A | 5.0 | 23 |
| A | 5.5 | 14 |
| B | 6.0 | 45 |
| B | 8.0 | 51 |
| B | 8.5 | 25 |
| B | 9.0 | 14 |

EXAMPLE 10

A stock solution was prepared as follows:
1.53 g of trimethylolpropane triacrylate
2.60 g of polymethyl methacrylate/methacrylic acid resin
0.23 g of triethylene glycol diacetate
0.45 g of conventional plasticizers
0.20 g of benzophenone
16 ml of methylene chloride +4 ml of 2-ethoxyethanol To one-half of this stock solution was added 0.01 g of adhesion promoter +0.025 g of Michler's ketone, and this modified solution was used to prepare the following two solutions:
A: ¼ of the modified solution (control)
B: ¼ of the modified solution +0.001 g of nitrosocyclohexane dimer.

Each solution was used to coat copper-clad circuit boards to give 1.3 mil (0.0033 cm) coatings as described in Example 7, and the layers were subsequently top-coated with polyvinyl alcohol solution. The boards were exposed as described; washout was carried out using a solution of 50 g of 2-butoxyethanol and 5 g of sodium tetraborate decahydrate in 455 g of water in a spray gun held 2 in (5.08 cm) from the samples. The highest resolution elements were determined for each plate, and the results are tabulated in Table X.

TABLE X

| Sample | Exposure Time (min.) | Resolution (line pairs/mm) |
|---|---|---|
| A (control) | 0.5 | 4 |
| A | 1.0 | 29 |
| A | 1.5 | 20 |
| A | 2.0 | 18 |
| A | 2.5 | 16 |
| B | 0.5 | 7 |
| B | 1.0 | 32 |
| B | 1.5 | 40 |
| B | 1.75 | 45 |
| B | 2.0 | 32 |
| B | 2.25 | 32 |
| B | 2.75 | 51 |
| B | 3.0 | 25 |

EXAMPLE 11

A stock solution was prepared as follows:
3.00 g of trimethylolpropane triacrylate
7.86 g of polyurethane binder
0.40 g of 2-o-chlorophenyl-4,5-diphenylimidazolyl dimer
0.01 g of Michler's ketone
0.02 g of adhesion promoter
0.03 g of tris(4-diethylamino-2-methylphenyl)methane
40 ml of methylene chloride One-eighth of this solution was coated onto a copper-clad circuit board, and the layer was subsequently top-coated with polyvinyl alcohol solution as described in Example 7, and this control sample was coded A. An additional coating, coded B, was prepared from one-eighth of the stock solution to which 0.005 g of nitrosocyclohexane dimer was added.

The boards were exposed and developed as described in Example 7 except that development was carried out with a mixture of 3 volumes of methyl chloroform +1 volume of n-butanol. The highest resolution elements were determined for each plate, and the results are tabulated in Table XI.

TABLE XI

| Sample | Exposure Time (min.) | Resolution (line pairs/mm) |
|---|---|---|
| A (control) | 0.5 | 11 |
| A | 1.0 | 9 |
| A | 1.5 | 11 |
| A | 2.0 | 11 |
| A | 2.5 | 8 |
| A | 3.0 | 7 |
| B | 0.5 | 14 |
| B | 1.0 | 18 |
| B | 1.5 | 18 |
| B | 2.5 | 16 |
| B | 3.5 | 9 |

EXAMPLE 12

A stock solution was prepared as follows:
2.90 g of trimethylolpropane triacrylate
0.88 g of conventional plasticizers
0.44 g of triethylene glycol diacetate
5.24 g of polymethyl methacrylate resin
0.02 g of adhesion promoter
40 ml of methylene chloride To one-half of this solution was added 0.40 g of benzoin methyl ether, and ¼ of this modified stock solution was coated onto a copper-clad circuit board, top-coated with polyvinyl alcohol solution as described in Example 7. The control sample was coded A. A second similarly coated board, 1.3 mils (0.0033 cm) in thickness, was prepared from solution B which was prepared as follows:

B: ¼ of modified stock solution +0.005 g of nitrosocyclohexane dimer.

After exposure and development as described, the highest resolution elements were determined for each plate, and the results are tabulated in Table XII.

TABLE XII

| Sample | Exposure Time (min.) | Resolution (line pairs/mm) |
|---|---|---|
| A (control) | 1.0 | 6 |
| A | 1.33 | 4 |
| A | 1.67 | 11 |
| A | 2.33 | 13 |
| B | 1.67 | 25 |
| B | 2.0 | 18 |
| B | 2.33 | 16 |

EXAMPLE 13

A stock solution was prepared as follows:
5.88 g of trimethylolpropane triacrylate
2.64 g of conventional plasticizers
10.48 g of polymethyl methacrylate resin
0.04 g of adhesion promoter
80 ml of methylene chloride To one-quarter of this solution was added 0.15 g of 2-ethylanthraquinone, and solutions A (control) and B were prepared from this modified stock solution as follows:

A: ¼ of the modified stock solution +0.10 g of triethylene glycol diacetate
B: ¼ of the modified stock solution +0.10 g of triethylene glycol diacetate +0.015 g of nitrosocyclohexane dimer.

Solutions A and B were coated onto copper-clad circuit boards, and the layers were subsequently top-coated with polyvinyl alcohol solutions as described in Example 7.

After exposure and development as described, the highest resolution elements were determined for each plate, and the results are tabulated in Table XIII.

TABLE XIII

| Sample | Exposure Time (min.) | Resolution (line pairs/mm) |
|---|---|---|
| A (control) | 0.5 | 8 |
| A | 1.0 | 4.5 |
| A | 1.5 | 4.5 |
| A | 2.0 | 4.0 |
| B | 2.0 | 14 |
| B | 5.0 | 13 |
| B | 9.0 | 40 |
| B | 13.0 | 40 |
| B | 15.0 | 29 |

EXAMPLE 14

A stock solution was prepared as follows:
- 5.80 g of trimethylolpropane triacrylate
- 1.76 g of conventional plasticizers
- 0.88 g of triethylene glycol diacetate
- 10.48 g of polymethyl methacrylate resin
- 0.04 g of adhesion promoter
- 0.80 g of 2-o-chlorophenyl-4,5-diphenylimadozoyl dimer
- 0.02 g of Michler's ketone
- 80 ml of methylene chloride Solution A (control) was prepared by adding 0.03 g of of tris(4-diethylamino-2-methylphenyl)methane to one-half of the above stock solution. Solution B was prepared by adding 0.01 g of

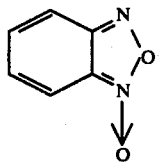

nitroso dimer to one-eighth of solution A. Solutions A and B were coated onto copper-clad circuit boards and subsequently top-coated with polyvinyl alcohol solutions as described in Example 7 to give 1.3-mil (0.0033 cm) photohardenable resist layers.

The boards were exposed and developed as described in Example 7 and the highest resolution elements were determined for each plate. The results are tabulated in Table XIV.

TABLE XIV

| Sample | Exposure Time (min) | Resolution (line pairs/mm) |
|---|---|---|
| A (control) | 0.33 | 13 |
| A | 0.50 | 25 |
| A | 0.67 | 23 |
| A | 0.83 | 11 |
| B | 4 | 9 |
| B | 5 | 9 |
| B | 8 | 14 |
| B | 10 | 45 |
| B | 15 | 25 |
| B | 20 | 23 |

EXAMPLE 15

A stock solution was prepared as follows:
- 5.80 g of trimethylolpropane triacrylate
- 1.76 g of conventional plasticizers
- 0.88 g of triethylene glycol diacetate
- 10.48 g of polymethyl methacrylate resin
- 0.04 g of adhesion promoter
- 0.80 g of 2-o-chlorophenyl-4,5-diphenylimidazoyl dimer
- 0.02 g of Michler's ketone
- 80 ml of methylene chloride Solution A (control) was prepared by adding 0.03 g of tris(4-diethylamino-2-methylphenyl)methane to one-half of the above stock solution. Solution B was prepared by adding 0.002 g of

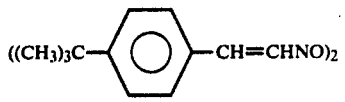

nitroso dimer to one-eighth of solution A. Solution C was prepared by adding 0.001 g of the same nitroso dimer to one-eighth of solution A. Solutions A, B, and C were coated onto copper-clad circuit boards and subsequently top-coated with polyvinyl alcohol solutions as described in Example 7 to give 1.3-mil (0.0033 cm) photohardenable resist layers.

The boards were exposed and developed as described in Example 7 and the highest resolution elements were determined for each plate. The results are tabulated in Table XV.

TABLE XV

| Sample | Exposure Time (min.) | Resolution (line pairs/mm) |
|---|---|---|
| A (control) | 0.17 | 14.3 |
| A | 0.33 | 20.0 |
| A | 0.50 | 18.0 |
| A | 0.67 | 14.3 |
| A | 0.83 | 14.3 |
| B | 1.0 | 32 |
| B | 1.5 | 40 |
| B | 2.0 | 40 |
| B | 2.5 | 45 |
| B | 2.67 | 45 |
| B | 2.83 | 36 |
| B | 3.0 | 64 |
| B | 3.2 | 36 |
| B | 3.3 | 32 |
| C | 1.5 | 28.5 |
| C | 2.25 | 64 |
| C | 2.50 | 32 |
| C | 2.75 | 32 |
| C | 3.0 | 22.5 |

By visual comparison with the films of Examples 1 and 2, it was observed that the optical densities of the films of Example 3–16 fall within the range of 0.02 to 1.25.

The embodiments of the invention in which an exclusive property or privilege is claimed are defined as follows:

1. A photohardenable film consisting essentially of:
   (a) a substantially solid organic composition comprising an addition-polymerizable, nongaseous ethylenically unsaturated compound capable of forming a high polymer by free-radical initiated chain-propagating addition polymerization, and a macromolecular organic polymeric binder,
   (b) 0.04–3% by weight, based on the total film material, of solvent-soluble nitroso dimer which is a noninhibitor of free-radical polymerization but dissociates to nitroso monomer which is an inhibitor of free-radical polymerization, contains a dinitroso group, and is characterized by a dissociation constant of $10^{-2}$–$10^{-10}$ in solution at 25° C. and a rate of dissociation having a half-life of at least 0.5 minute in solution at 25° C., and
   (c) 1.0–10% by weight, based on the total film material, of an organic, radiation-sensitive free-radical generating system based on a 2,4,5-triarylimidazolyl dimer and a free-radical producing electron doner system, with the proviso that the weight ratio of nitroso dimer to free-radical generating system is no greater than 2:1, said free-radical generating system being proportioned to give said film at its particular thickness a mean optical density of 0.02–1.25 to radiation in the spectral region in which the free-radical generating system absorbs radiation.

2. The film of claim 1 wherein the nitroso dimer is present in the amount of 0.1–2% by weight.

3. The film of claim 2 wherein the polymeric binder is present in the amount of 3–95% by weight based on the total film material.

4. The film of claim 3 wherein the 2,4,5-triarylimidazolyl dimer is 2-(o-chlorophenyl)-4,5-diphenylimidazolyl dimer.

5. The film of claim 4 wherein the free-radical producing electron donor system is tris(4-diethylamino-2-methylphenyl)methane.

6. The film of claim 5 wherein Michler's ketone is also present as a sensitizer.

7. The film of claim 3 wherein said nitroso dimer is selected from the group consisting of

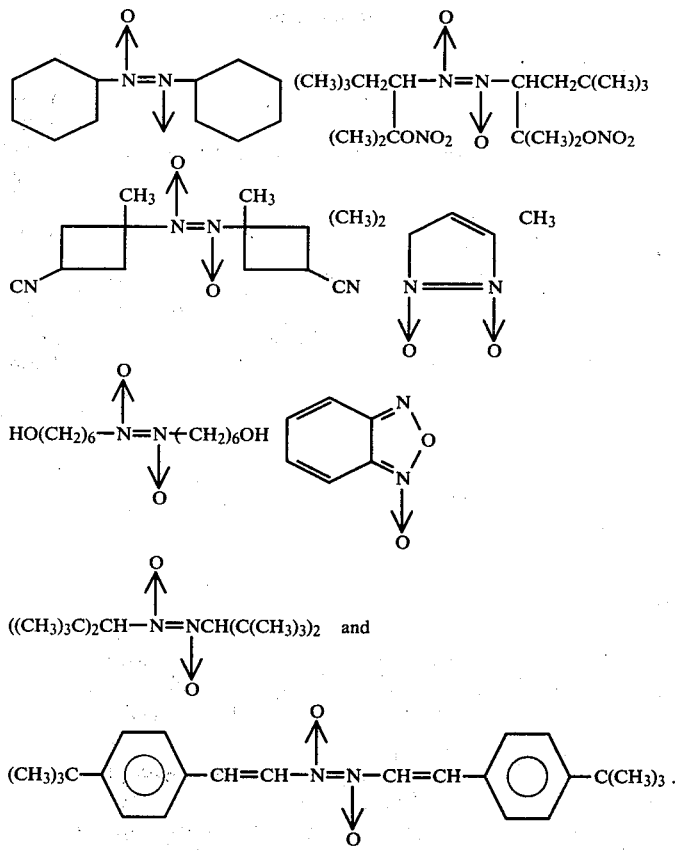

8. The film of claim 7 wherein the optical density is 0.24–0.51.

9. The film of claim 7 wherein the nitroso dimer is present in the amount of 0.3–1.5% by weight.

10. The film of claim 8 wherein the nitroso dimer is

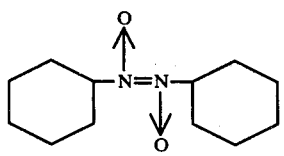

11. The film of claim 1 in the form of a coating on a substrate.

* * * * *